United States Patent [19]

Sakurai

[11] Patent Number: 5,200,632
[45] Date of Patent: Apr. 6, 1993

[54] CONDUCTIVITY MODULATION MOSFET

[75] Inventor: Kenya Sakurai, Kanagawa, Japan

[73] Assignee: Fuji Electric Co., Ltd., Kanagawa, Japan

[21] Appl. No.: 686,937

[22] Filed: Apr. 18, 1991

[30] Foreign Application Priority Data

Apr. 20, 1990 [JP] Japan .................................. 2-104838

[51] Int. Cl.[5] ..................... H01L 29/74; H01L 27/02; H01L 29/10
[52] U.S. Cl. ...................................... 257/212; 257/378
[58] Field of Search ...................... 357/38, 43, 86, 23.4

[56] References Cited

U.S. PATENT DOCUMENTS

| 4,292,646 | 9/1981 | Assour et al. ........................... 357/38 |
| 4,587,547 | 5/1986 | Amemiya et al. ..................... 357/59 |
| 4,617,583 | 10/1986 | Shinohe et al. ......................... 357/38 |
| 4,689,647 | 8/1987 | Nakagawa et al. ................. 357/23.4 |
| 4,841,345 | 6/1989 | Majumdar ........................... 357/23.4 |
| 4,888,627 | 12/1989 | Pattanayak et al. ............... 357/23.4 |
| 4,918,509 | 4/1990 | Schlangenotto ...................... 357/38 |

FOREIGN PATENT DOCUMENTS 61-208268  9/1986  Japan .................................. 357/23.4

OTHER PUBLICATIONS

A. M. Goodman, et al., "Improved COMFETs with fast Switching Speed and High-Current Capability", Extended Abstract IEDM 83, pp. 79-82.
B. Jayant Baliga, "Switching Speed Enhancement in Insulated Gate, Transistors by Electron Irradiation", IEEE Transactions on Electron Devices, vol. Ed-31, No. 12, Dec. 1984, pp. 1790-1795.
Jerry G. Fossum, et al., "Charge-Control Anslysis of the COMFET Turn-Off", IEEE Transactions on Electron Devices, vol. ED-33, No. 9, Sep. 1986, pp. 1377-1382.
L. Lorenz, et al., "Switching Performance of a New Fast IGBT", Abstract, PCI, Jun. 1988 Proceedings, pp. 189-203.

Primary Examiner—Andrew J. James
Assistant Examiner—Stephen D. Meier
Attorney, Agent, or Firm—Finnegan, Henderson, Farabow, Garrett & Dunner

[57] ABSTRACT

A conductivity modulation type MOSFET including a first region of a first conductivity type having a low impurity concentration, second regions of a second conductivity type selectively formed on the surface region of one side of the first region, third regions of the first conductivity type selectively formed on the surface region of the second regions, gate electrodes each formed above the surface region of the second region located between the first region and the third region, a plurality of gate insulating films interlayered between the gate electrodes and the surface region of the second regions, an emitter electrode in contact with both the second regions and the third regions, a fourth region of the second conductivity type having a high impurity concentration, formed adjoining to another side of the first region, fifth regions of the second conductivity type, selectively formed surrounding the fourth region, having a lower impurity concentration than that of the fourth region, and a collector electrode being in contact with both the fourth region and the fifth regions.

5 Claims, 6 Drawing Sheets

CONDUCTIVITY MODULATION MOSFET

BACKGROUND OF THE INVENTION

1. Field of the Invention

The present invention relates to a conductivity modulation MOSFET used in applications such as a power switching device and a method of making the same.

2. Discussion of the Related Art

A conductivity modulation MOSFET, also called an insulated gate bipolar transistor (IGBT), is constructed such that the drain region of a vertical power MOSFET is used as a collector layer whose conductivity type is opposite to that of the source region.

The structure of the conventional conductivity modulation MOSFET will be described using an n-channel IGBT, however, a p-channel IGBT may be used as well. In FIG. 2, an n+ buffer layer 2 of medium impurity concentration is layered over a p+ collector layer 1 and an n− high resistance layer 3 is further layered over the buffer layer 2. P-base diffusion regions 4 are selectively formed on the surface region of the high resistance layer 3. Further, n+ emitter diffusion regions 5 are selectively formed on the surface regions of the base diffusion regions 4.

Gate electrodes 6 made of polycrystalline silicon are formed above the surface of the structure, with gate oxide films 7 being interlayered therebetween. An emitter electrode 9 contacts both the base diffusion regions 4 and the emitter diffusion regions 5. The emitter electrode 9 is insulated from the gate electrodes 6 by insulating films 8. A collector electrode 10 is in contact with the collector layer 1. The gate electrode 6 is connected to a gate terminal G; the emitter electrode 9 is connected to an emitter terminal E; and the collector electrode 10 is connected to a collector terminal C.

In the IGBT thus constructed, if a voltage, positive with respect to the emitter electrode 9, is applied to the gate electrode 6, an inversion layer is formed in a channel region 11 of the base region 4 which is located between the emitter diffusion region 5 and the n− high resistance layer 3. Electrons from the emitter diffusion region 5 pass through the channel to be injected into the high resistance layer 3. Consequently, the potential of the high resistance layer drops to be equal to that of the emitter electrode 9, and the junction between the p+ collector layer 1 and the n− layer 3 is forwardly biased. Under this condition, hole current is injected from the p+ collector layer 1 into the high resistance layer through the n+ layer 2. The injection of the minority carriers causes the conductivity modulation effect in the structure, and hence, reduces the resistance of the n− layer 3. Accordingly, the resultant conduction modulation MOSFET has an on-resistance much smaller than that of the ordinary MOSFET.

The turn-off of the MOSFET of this type is achieved by reducing the MOS gate voltage to 0 V or a negative voltage. The turn-off state terminates at the instant the electrons and holes accumulated in the n− high resistance layer 3 disappear completely. The holes accumulated in the n− high resistance layer 3 reach the emitter electrode 9 via the p-base region 4. The electrons are either combined with the holes within the n− high resistance layer 3 or attracted to the p+ collector layer 1.

The turn-off phenomenon of the IGBT resembles that of the open-base bipolar transistor and takes a relatively long duration of time. In particular, the turn-off loss caused by the exponentially decreasing fall current, called a tail current, is very large, and is one of the major defects of the conductivity modulation MOSFET. The insertion or use of the n+ buffer layer 2, which functions to reduce the hole injection efficiency, is one of the measures taken for this defect, as described in "Extended Abstract IEDM 83", p. 79 (1983). To reduce the lifetime of the n− high resistance layer, there has been proposed various lifetime control methods, as described in IEEE Trans. Electron Devices, ED-31, p. 1790 (1945). To eliminate the electrons which have accumulated during the turn-off period, the electrons are pulled to the collector electrode by a collector short IGBT, in which the collector electrode 10 is shorted to the high resistance layer 3 (FIG. 2), as proposed in PCIM '88 Proc. p. 189 (1988). In the proposal, the short-circuiting of the collector electrode 10 with the high resistance layer 3 reduces the quantity of the holes injected and provides a path connecting to the collector electrode 10. Accordingly, the carriers are rapidly pulled out to reduce the turn-off time.

However, since the proposal of the insertion of the buffer layer reduces the quantity of the injected holes, the conductivity modulation effect is degraded and the on voltage is increased. A proposal of the lifetime control is also relevant with the increase of the on-resistance to reduce the lifetime of the thick high resistance layer.

FIG. 3 illustrates an exemplar of a collector short IGBT having a breakdown voltage of about 1200 V. In the illustration showing the structure and dimensions of the IGBT, the n− high resistance layer 3 and the collector electrode 10 are shorted by the n+ layer 2 adjoining the p+ layer 1. The p+ layer 1 and the n+ layer 2 are formed by diffusing an impurity material into an n− substrate of 200 um thick to the depth of approximately 30 um. In fabricating the IGBT of FIG. 2 so as to have a breakdown voltage of about 1200 V, an 100 um thick epitaxial layer, which consists of the n+ layer 2 and the n− layer 3, is grown on the p+ substrate layer 10 of 500 um thick. To realize such a thin n− layer 3 in the structure of FIG. 3, a thin substrate must be used. However, the thickness of the substrate must be at least 200 um because of the geometrical requirements for the substrate in the diffusion process. Accordingly, the movement of the carriers accumulated in the thick n− high resistance layer 3 becomes slow, and the tail current becomes long. To improve these defects, a lifetime control may be employed. The reduction of the lifetime of the thick n− high resistance layer 3 leads to a considerable increase of the on-voltage.

Turn-off waveforms of the IGBT for different loads coupled therewith are illustrated in FIGS. 4(a)-4(c). FIG. 4(a) shows a turn-off waveform for a resistive (R) load; FIG. 4(b) shows a turn-off waveform for an inductance (L) load; and FIG. 4(c) shows a turn-off waveform for a resonance-circuit load. In the turn-off waveform shown in FIG. 4(b), which is generated when the L load is turned off, the collector-emitter voltage varies little in the tail portion of the waveform. A high voltage is applied to the collector. Accordingly, the collector electrode rapidly pulls the electrons from the high resistance layer and the fall current decreases relatively sharply. In the turn-off waveform of FIG. 4(c) for the resonance-circuit load, when the decreasing current approaches its termination, the collector-emitter voltage starts to increase rapidly. The rapidly increasing change, dv/dt, produces Cdv/dt, viz., a junction capacitance displacement current, and electrons are discharged from a growing depletion layer and attracted to the collector electrode. The holes accumulated in the n− high resistance layer are attracted to the depletion layer. The electron current discharged from the depletion layer, as a base current, triggers the injection of the holes from the p+ collector layer. Those actions, in conjunction with the Cdv/dt current, generate a relatively large current $I_f$ as shown, resulting in a large turn-off loss, where the turn-off loss is defined by $$\int_0^t V \cdot I dt$$

after the turn-off. To reduce the turn-off loss, it is necessary to reduce the hole current based on the Cdv/dt. In other words, it is necessary to eliminate the holes as rapidly as possible. To do this, the formation of a conduction path of the electron current to the collector and the reduction of lifetime of the high resistance layer are essential. In the collector short IGBT having the conduction path of the electron current to the collector electrode, it is impossible to reduce the lifetime because the high resistance layer is too thick.

Similar problems also exist in the p-channel IGBT where the conductivity type and hence the carrier moving directions are opposite to the n-channel IGBT.

SUMMARY OF THE INVENTION

The present invention has been made in view of the above circumstances and accordingly, an object of the present invention is to solve the problems as referred to above.

Another object of the present invention is to provide a conductivity modulation MOSFET, and a method for making the same, in which a conduction path is formed for the majority carriers present in the high resistance layer during the turn-off period.

A further object of the present invention is to reduce the lifetime of the high resistance layer of the conductivity modulation MOSFET.

Additional objects and advantages of the invention will be set forth in part in the description that follows and in part will be obvious from the description, or may be learned by practice of the invention. The objects and advantages of the invention may be realized and attained by means of the instrumentalities and combinations particularly pointed out in the appended claims.

To achieve the objects and in accordance with the purpose of the invention, as embodied and broadly described herein, the conductivity modulation type MOSFET of the present invention includes a first region of a first conductivity type having a low impurity concentration, a plurality of second regions of a second conductivity type selectively formed on the surface region of one side of the first region, a plurality of third regions of the first conductivity type selectively formed on the surface region of the second regions, a plurality of gate electrodes each formed above the surface region of the second region located between the first region and the third region, a plurality of gate insulating films interlayered between the gate electrodes and the surface region of the second regions, an emitter electrode in contact with both the second regions and the third regions, a fourth region of the second conductivity type having a high impurity concentration, formed adjoining to another side of the first region, a plurality of fifth regions of the second conductivity type, selectively formed surrounding the fourth region, to have a lower impurity concentration than the impurity concentration of the fourth region, and a collector electrode in contact with both the fourth region and the fifth regions.

The above objects of the invention may also be achieved by a conductivity modulation type MOSFET including a first region of a first conductivity type having a low impurity concentration, a plurality of second regions of a second conductivity type selectively formed on the surface region of one side of the first region, a plurality of third regions of the first conductivity type selectively formed on the surface region of the second regions, a plurality of gate electrodes each formed above the surface region of the second region located between the first region and the third region, a plurality of gate insulating films interlayered between the gate electrodes and the surface region of the second regions, an emitter electrode in contact with both the second regions and the third regions, a fourth region of the first conductivity type, formed adjoining to another side of the first region to have a lower impurity concentration than the impurity concentration of the first region, a plurality of fifth regions selectively formed in the fourth region to have a higher impurity concentration than that of the fourth region, a sixth region of the second conductivity type adjoining to the sides of the fourth region and the fifth regions, and being opposite to the sides of the regions in contact with the first region, the impurity concentration of the sixth region being high but lower than the impurity concentration of the fifth region, and a collector electrode in contact with the sixth region.

The present invention further contemplates a method for producing a conductivity modulation type MOSFET comprising the steps of depositing a diffusion protecting film over a first surface of a silicon wafer of a first conductivity having an impurity concentration, forming openings in the deposited protecting film, doping a dopant through the first surface into the silicon wafer to a predetermined depth, the dopant having a second conductivity and a higher impurity concentration than the impurity concentration of the silicon wafer, grinding a second surface, opposite to the first surface, to cut away the silicon wafer by a predetermined thickness, polishing the second surface, applying a IGBT manufacturing process to the wafer, and attaching an emitter electrode, a gate electrode and a collector electrode.

The present invention further contemplates a method of producing a conductivity modulation type MOSFET comprising the steps of, growing a first epitaxial layer of first conductivity on a silicon substrate of a second conductivity, the first epitaxial layer having an impurity concentration, forming a diffusion protecting film over the first epitaxial layer, forming windows selectively in the diffusion protecting film by an etching process, diffusing an impurity into the epitaxial layer through the windows thereby forming a plurality of regions containing a higher impurity concentration than that of the first epitaxial layer or the silicon substrate, growing a second epitaxial layer of the first conductivity to a predetermined thickness on the first epitaxial layer, the second epitaxial layer having a lower impurity concentration than the impurity concentration of the first epitaxial layer, and applying an IGBT manufacturing process.

BRIEF DESCRIPTION OF THE DRAWINGS

The accompanying drawings, which are incorporated in and constitute a part of this specification illustrate embodiments of the present invention and, together with the description, serve to explain the objects, advantages, and principles of the invention. In the drawings.

FIGS. 4(a) through 4(c) are waveform diagrams showing turn-off waveforms for different types of loads, in which FIG. 4(a) shows a turn-off waveform for a resistive load, FIG. 4(b) shows a turn-off waveform for an inductive load, and FIG. 4(c) shows a turn-off waveform for a resonant circuit;

DETAILED DESCRIPTION OF THE PREFERRED EMBODIMENTS

A method has been proposed in which the majority carriers existing in the first region of high resistance are attracted to the collector layer, viz., the majority carriers are reinjected into the collector without using the collector short structure. When considering the method by using the n-channel IGBT as an example, as analyzed by J. G. Fossum et al. in IEEE Trans. Electron Devices, ED-33, No. 9 (1986), the reinjection of electrons from the n$^-$ high resistance layer into the p$^+$ collector layer can be realized by increasing a saturation current $J_{NO}$ relating to the electron injection into the p$^+$ collector layer and the recombination of the electrons.

In the present invention, the saturation current can be increased by improving the efficiency of the electron reinjection, which may result from decreasing the p$^+$ impurity concentration. The method for forming the structure, provides that in the fourth regions of the second conductivity type adjoining to the collector side of the first region, whose impurity concentration is high, the fifth region of the second conductivity type with an impurity concentration lower than that of the fourth region. The collector electrode contacts both regions. The two regions are can be formed in such a way that the fourth regions are of local, deep diffusion regions and the fifth region is of a low impurity concentration formed by the lateral diffusion. The fourth regions are formed on the surface region of one of the sides of the thick substrate of the first conductivity type and the remaining substrate region of the first conductivity type is used as the first region of the first conductivity type. The second and third regions are formed on the surface region of and on the other side of the substrate. Accordingly, the first region may be thinner than the substrate, and hence, the lifetime control of the first region is possible.

Figure 2:
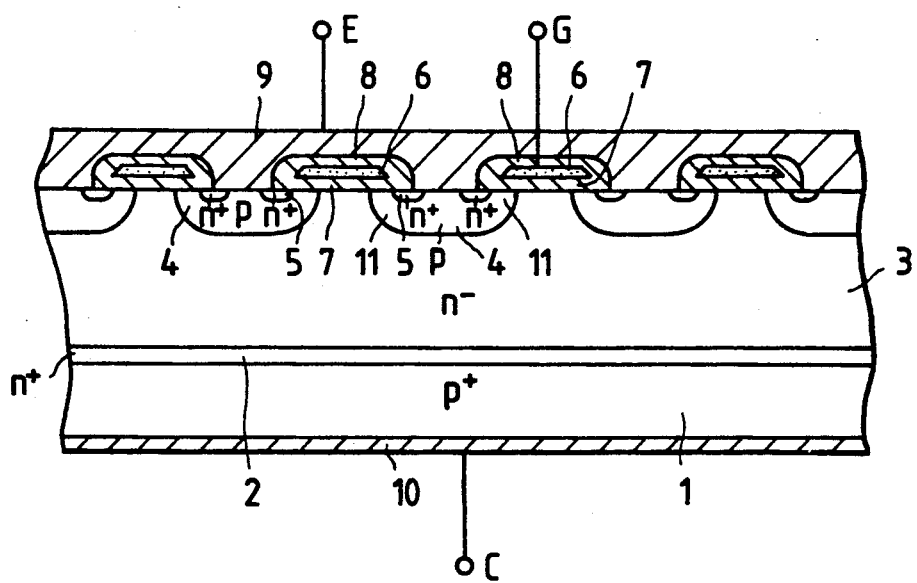
FIG. 2 is a sectional view showing a key portion of a conventional IGBT.
Figure 3:
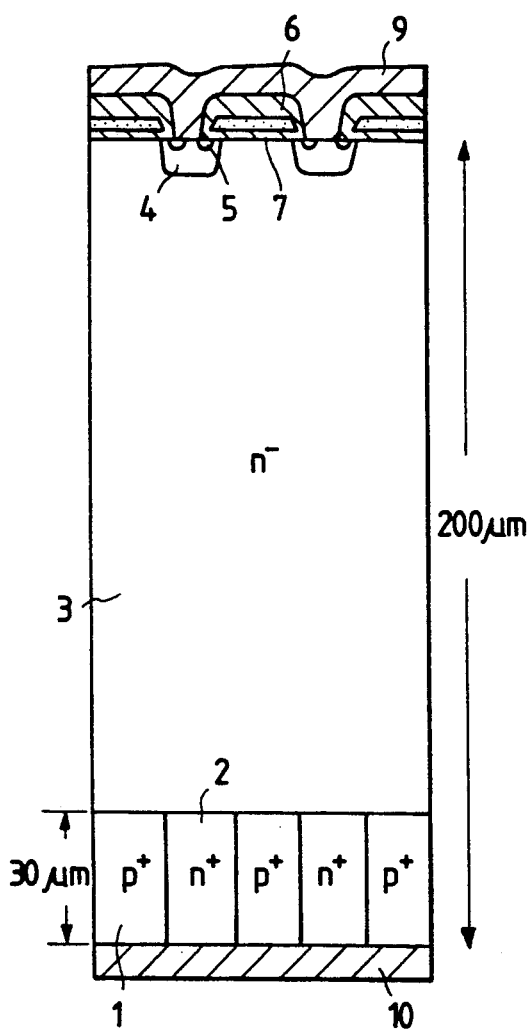
FIG. 3 is a sectional view showing the structure of a collector short IGBT.
Figure 4A:
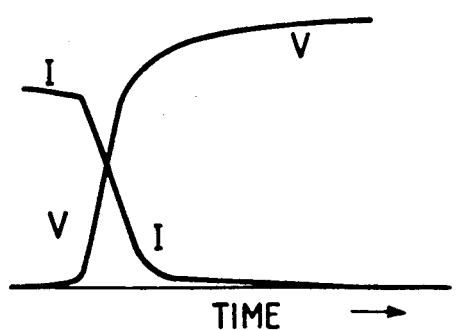
Figure 4B:
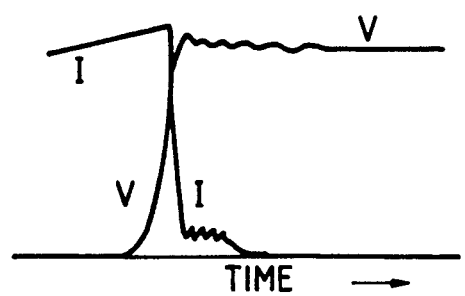
Figure 4C:
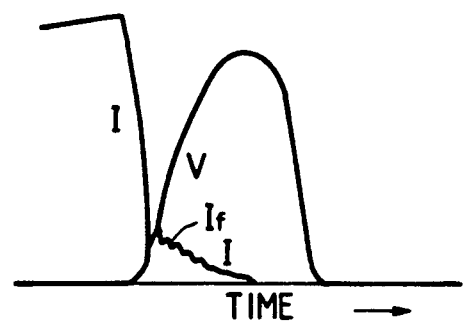

Alternatively, the n$^{++}$ regions may be partially formed in the n$^+$ buffer layer, which is contained in the conventional n-channel IGBT. With this structure, electrons are readily movable toward the n$^{++}$ buffer regions. If the impurity concentration of the n$^{++}$ region is set to be higher than that of the p$^+$ collector region, electrons are readily and reversely injected into the p$^+$ collector regions where they are recombined with holes and disappear. The structure in which, in the fourth region of the first conductivity type, located as the buffer region between the first region whose emitter side structure is the same as that of the conventional MOSFET and the sixth region of the second conductivity type, the fourth region being in contact with the collector electrode and having higher impurity concentration than that of the first region, is partially formed the fifth regions of higher impurity concentration than that of the sixth region. A first epitaxial layer of the first conductivity type is formed on the substrate of the second conductivity type and an impurity is locally diffused into the first epitaxial layer to form the fourth and fifth regions. A second epitaxial layer of the first conductivity type having a low impurity concentration serving as the first region is grown on the fourth and fifth regions. Therefore, in the alternative structure, the first region may be thinned as in the IGBT of FIG. 2, and hence, the lifetime control may also be realized.

Preferred embodiments of a conductivity modulation MOSFET according to the present invention will be described with reference to the accompanying drawings. Throughout the drawings, like or equivalent portions are designated by like reference symbols.

Figure 1:
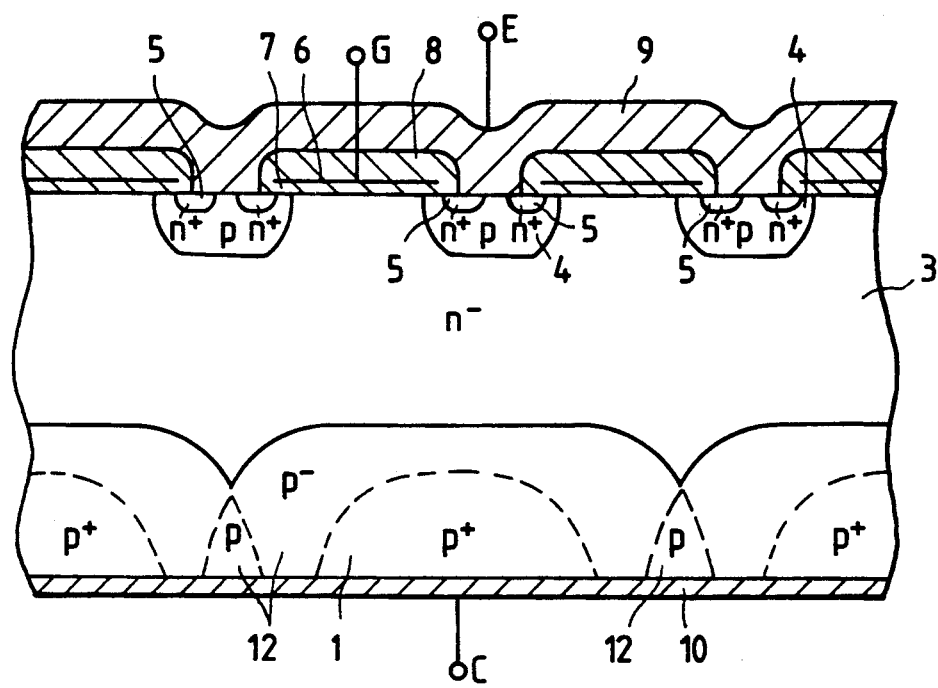
FIG. 1 is a sectional view showing a key portion of an IGBT according to an embodiment of the present invention.

FIG. 1 shows an embodiment of a conductivity modulation MOSFET according to the present invention. In the illustration of FIG. 1, the side of the MOSFET structure including the emitter electrode 9 is simplified. In the embodiment, a p-type collector layer directly exists between the n$^-$ high resistance layer 3 and the collector electrode 10. The collector layer is formed of a p$^+$ diffusion region 1 contacting the collector electrode 10 and a p$^-$ diffusion layer 12 of a low impurity concentration (about $10^{15}$cm$^{-3}$), which surrounds the diffusion region 1 and is in contact with the collector electrode 10 in portions other than the diffusion region 1.

Figure 5A:
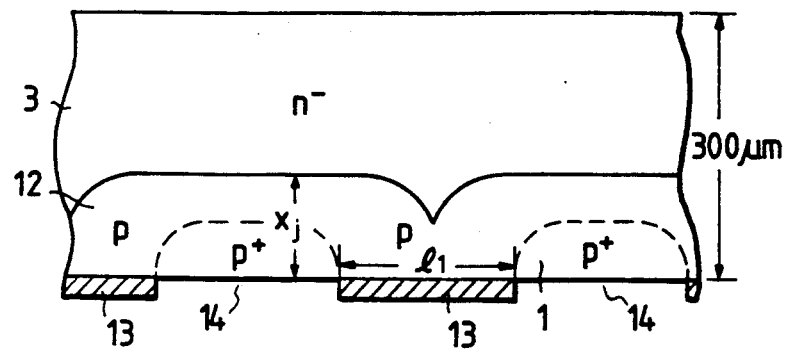
FIGS. 5(a) and 5(b) are sectional views showing the process steps to manufacture the IGBT of FIG. 1.
Figure 5B:
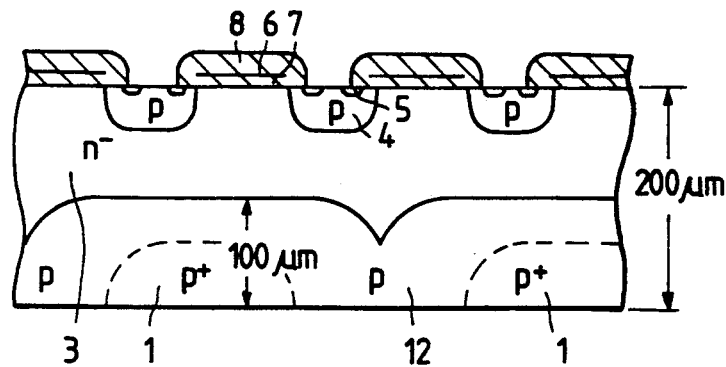

FIGS. 5(a) and 5(b) show sectional views explaining the process of manufacturing the structure of FIG. 1. In FIG. 5(a), a boron diffusion protecting film 13 is deposited over one of the surfaces of an n$^-$ silicon wafer of approximately 300 um thick, and openings 14 are formed in the deposited protecting film 13 by a photoetching process. A high concentration (about $10^{18}$cm$^{-3}$) of a dopant, such as boron, aluminum or gallium, is then doped through the processed surface into the structure up to a desired depth of Xj (e.g., Xj=100 um), by a drive-in diffusion technique. In this case, the width $l_1$ of the diffusion protecting film is chosen to be preferably within the range of Xj to 2Xj. If so selected, the diffusion portions overlap to eliminate the exposed portions of the n$^-$ layer.

Collector regions 1 of high impurity concentration are respectively formed by the diffusion process on the portions of the n$^-$ layer where the openings 14 are formed. A collector region 12 of low impurity is formed covering the collector regions 1. In the collector region 12, although the adjacent diffusion regions overlap each other, the impurity concentration of those overlapping regions is at their lowest, and hence, the summed impurity concentration of the overlapping regions remains low. Afterwards, the surface of the silicon wafer, located opposite to the processed surface, is ground to cut away the wafer by a thickness of approximately 100 um, and then the surface is mirror polished. In this manner, the p+ - n wafer of 200 um thick containing the n-layer of 100 um thick is formed.

Figure 9A:
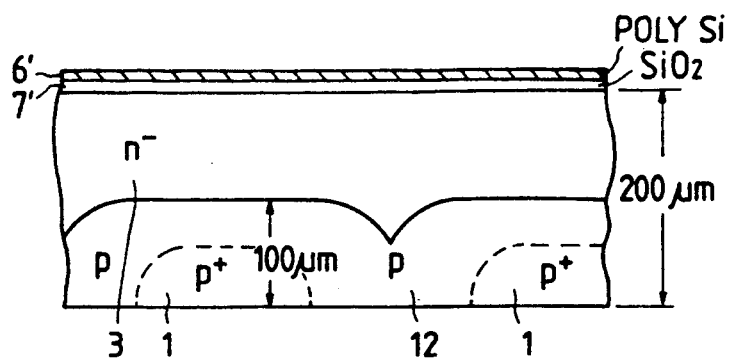
FIGS. 9(a) through 9(d) are views for explaining the IGBT manufacturing process.
Figure 9B:
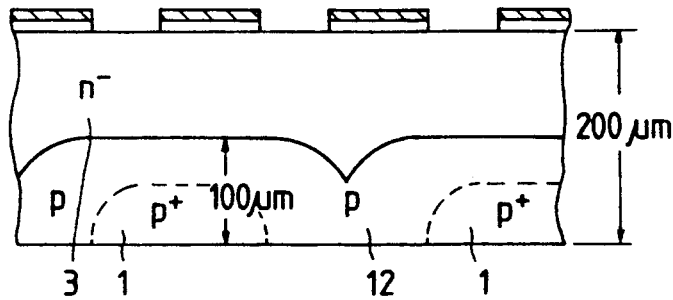
Figure 9C:
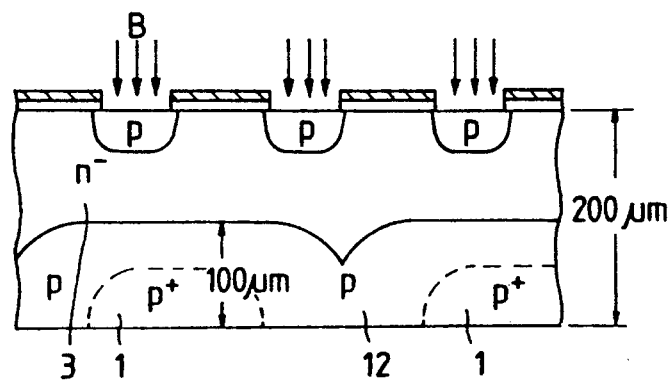
Figure 9D:
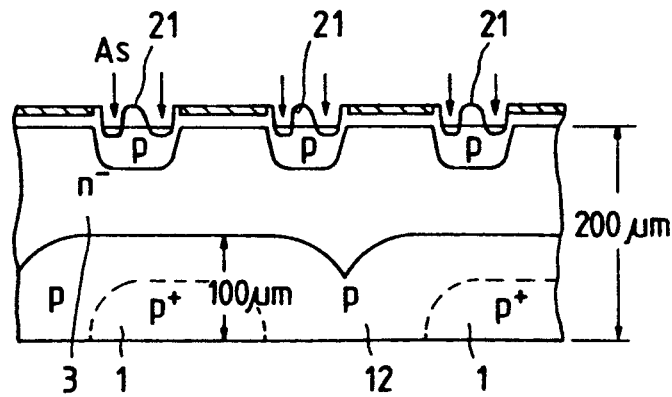

The IGBT manufacturing process is applied to the wafer formed to produce the structure as shown in FIG. 5(b). The IGBT manufacturing process comprises the steps of depositing a $SiO_2$ film 7' and a polysilicon film 6' on the grounded surface (FIG. 9(a)), removing some parts of the films by etching (FIG. 9(b)), implanting boron ions using the pattern of the films and diffusing the ions (FIG. 9(c)), implanting As ions using the pattern of resist film 21 (FIG. 9(d)), removing the resisting pattern and depositing insulating film 8 to produce the structure as shown in FIG. 5(b). By additionally attaching the emitter electrodes, the gate electrodes and the collector electrodes to the structure, the structure shown in FIG. 1 is completed.

Figure 6:
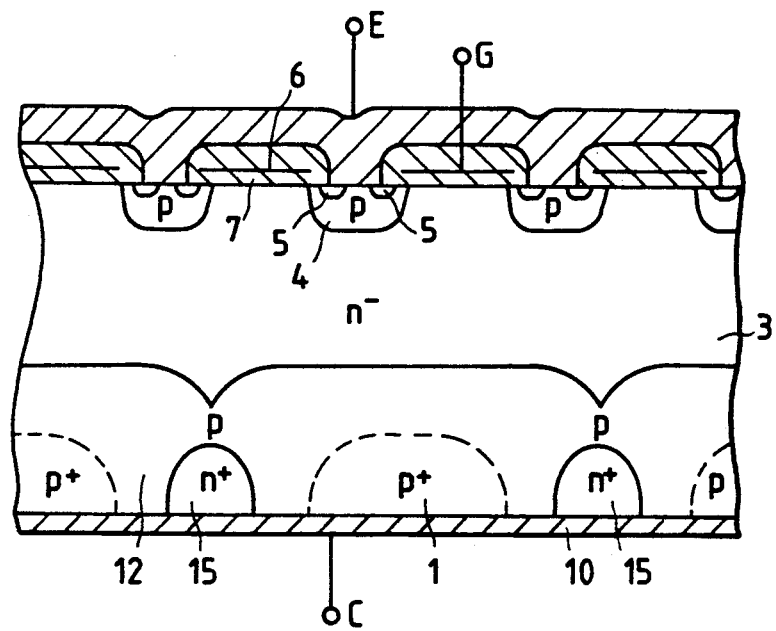
FIG. 6 is a sectional view showing a key portion of an IGBT according to another embodiment of the present invention.

The manufacturing process as mentioned above minimizes the thickness of the n− high resistance layer 3. Since the thickness of the n− high resistance layer 3 is minimized, the lifetime control to reduce the lifetime of holes is possible. The collector region 12 of low impurity concentration allows the reverse injection of the accumulated electrons, increasing the switching speed of the resultant MOSFET. Further, by coupling the structure with the resonance-circuit load, the turn-off loss can be reduced. Also, the manufacturing cost is reduced because the epitaxial wafer is not used in the MOSFET. If required, the reverse injection of electrons may be facilitated by locally forming n+ regions 15 in the collector region 12 of low impurity concentration, as shown in FIG. 6. In FIG. 6, during the turn-off process, the electrons accumulated in the n− high resistance layer 3 are reversely injected into the low impurity concentration regions 12 and easily reach the n+ regions 15, to recombine with holes and disappear in the collector electrode 10. The n+ regions 15 may be produced, similar to the way p+ impurities were diffused in FIG. 5, by forming windows in the boron diffusion protecting film 13 and diffusing the n+ impurity into the structure therethrough.

Figure 7:
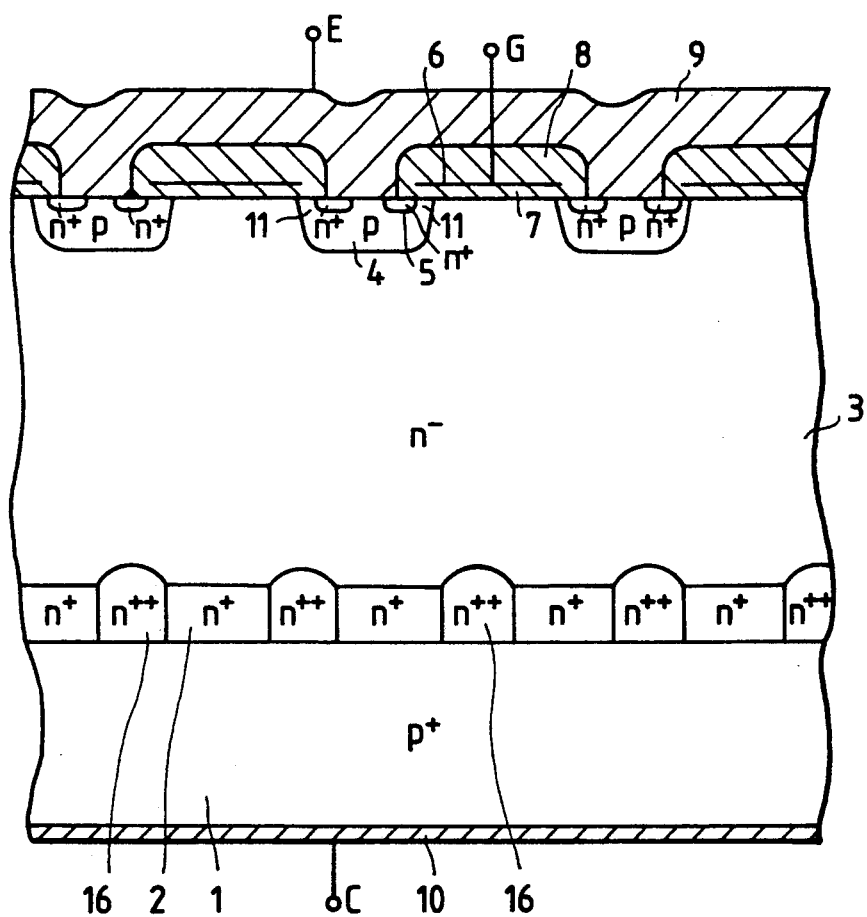
FIG. 7 is a sectional view showing a key portion of an IGBT according to another embodiment of the present invention.
Figure 8A:
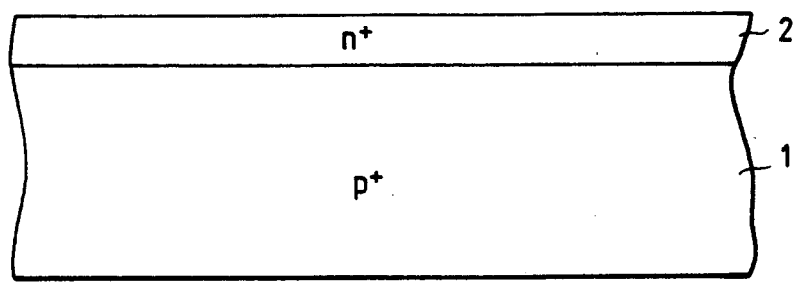
FIGS. 8(a) through 8(c) are sectional views showing the process steps to manufacture the IGBT of FIG. 7.
Figure 8B:
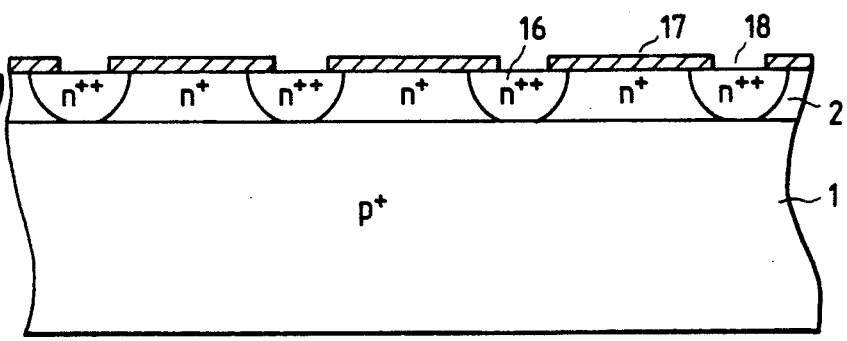
Figure 8C:
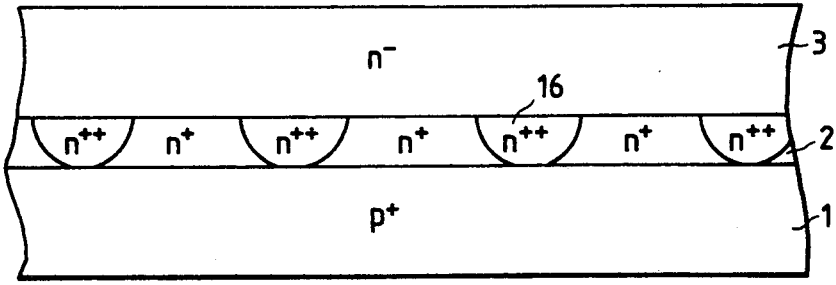

In FIG. 7, another embodiment of a conductivity modulation MOSFET according to the present invention is shown. In the MOSFET, n++ buffer regions 16 of high impurity concentration (about $10^{18} cm^{-3}$) are locally formed in the n+ buffer layer 2 in the structure of FIG. 2. A process of manufacturing the MOSFET of such a structure is shown in FIGS. 8(a) through 8(c). To start, an n+ epitaxial layer 2 is grown on a p+ silicon substrate 1, as shown in FIG. 8(a). As shown in FIG. 8(b), a diffusion protecting film 17 is formed over the epitaxial layer 2, windows 18 are selectively formed in the diffusion protecting film 17 by an etching process, and the proper impurity is diffused into the structure through the windows 18. As a result, the n++ regions 16 are formed, of which the impurity concentration is higher than that of the n+ buffer layer 2 and that of the p+ substrate 1.

As shown in FIG. 8(c), an n− epitaxial high resistance layer 3 of an appropriate thickness is then grown over the surface of the structure thus processed. Finally, the IGBT manufacturing process is applied to the resultant structure to form the structure shown in FIG. 7. Because of the buffer layer, the MOSFET of the embodiment shown is FIG. 7 may realize a high breakdown voltage, with the n+ high resistance layer 1 being thinner than that of the corresponding one of the structure of FIG. 1. In the structure of FIG. 7, electrons accumulated in the n− layer readily move into the n+ buffer layer 2 during the turn-off process. The impurity concentration of the n++ regions 16 locally present in the buffer region is higher than that of the p+ substrate 1 of the collector layer. Therefore, the reverse injection of the electrons into the collector layer can be achieved readily. The injected electrons are recombined with holes and disappear in the collector layer 1.

As described above, in the collector layer of the second conductivity having high impurity concentration, which is formed on the collector side of the high resistance layer of the first conductivity type, the collector regions of the second conductivity type are locally formed having lower impurity concentration than that of the collector layer. Alternatively, the regions of the first conductivity type having higher impurity concentration than that of the collector layer, are locally formed in the buffer layer of the first conductivity type having medium impurity concentration, located between the high resistance layer of the first conductivity type and the collector layer of the second conductivity type. With such a structure, a current conduction path for the majority carriers accumulated in the high resistance layer, leading to the collector, is realized by utilizing the inverse injection. Further, the thickness of the high resistance layer may be thinned to such an extent that an increase of the on-voltage is considerably reduced to reduce the lifetime. Thus, the formation of the current conduction path for the majority carriers and the use of the lifetime control are both available. Therefore, the present invention can provide a conductivity modulation MOSFET of which the turn-off loss is greatly reduced for every application circuit.

In the following, the process of operation is presented in which the high resistance layer of the MOSFET is thinned to reduce the lifetime, and hence, achieve the lifetime control of the present invention.

A method has been proposed in which the majority carriers existing in the first region of high resistance are attracted to the collector layer, viz., the majority carriers are reinjected into the collector without using the collector short structure. When considering the method by using the n-channel IGBT as an example, as analyzed by J. G. Fossum et al. in IEEE Trans. Electron Devices, ED-33, No. 9 (1986), the reinjection of electrons from the n− high resistance layer into the p+ collector layer can be realized by increasing a saturation current $J_{NO}$ relating to the electron injection into the p+ collector layer and the recombination of the electrons. In the present invention, the saturation current can be increased by improving the efficiency of the electron reinjection, which may result from decreasing the p+ impurity concentration. In the structure of FIG. 1, the p+ collector layer 1 is formed adjacent to the collector side of the n-high resistance layer and with a high impurity concentration. Surrounding the p+ collector layer 1, a p− diffusion layer 12 is formed with an impurity concentration lower than the p+ collector layer 1. The p+ collector layer 1 and the p− diffusion layer 12 are formed such that the collector electrode 10 contacts both layers with the p+ collector layer 1 being a deep diffusion region and the p− diffusion layer 12 being a lateral diffusion region. The p+ collector layer is initially formed on the surface of a thick n− substrate. The remaining n− substrate is the n− high resistance layer 3. A p-base diffusion regions 4 and an n+ emitter diffusion regions 5 are formed on the n− high resistance layer of the side opposite to the collector layer 1. Accordingly, the n− high resistance layer is thinner than the substrate, and hence, the lifetime control of the n− high resistance layer is realized.

Alternatively, in FIG. 7, n++ regions 16 may partially form in the n+ buffer layer 2. With this structure, electrons are readily movable toward the n++ regions 16. If the impurity concentration of the n++ region 16 is set to be higher than that of the p+ collector region 1, electrons are readily and reversely injected into the p+ collector regions 1 where they are recombined with holes and disappear. In the structure of FIG. 7, the n+ buffer layer 2 located between the n+ high resistance layer 3 and the p+ collector region 1. The emitter side of the n+ high resistance layer 3 is the same as that of the conventional MOSFET.

The n+ buffer layer 2 is in contact with the collector electrode and has a higher impurity concentration than that of the n− high resistance layer 3. Within the n+ buffer layer 2, the n++ regions 16 is formed having a higher impurity concentration than that of the p+ collector layer 1. Initially, an n-type epitaxial layer is formed on a p-type substrate. The n+ buffer layer 2 and the n++ regions 16 are formed by locally diffusing the impurities into the n-type epitaxial layer. Another n-type epitaxial layer of a lower impurity concentration is grown on the n+ buffer layer 2 and the n++ regions 16. Accordingly, in the alternative structure, the n− high resistance layer is thinned as in the IGBT of FIG. 2, and hence, the lifetime control is realized.

The foregoing description of preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A conductivity modulation type MOSFET comprising:

a first region of a first conductivity type having a low impurity concentration;

a plurality of second regions of a second conductivity type selectively formed in a surface region of one side of the first region;

a plurality of third regions of the first conductivity type selectively formed in a surface region of the second regions;

a plurality of gate electrodes each formed above a surface region of the second region located between the first region and the third region;

a gate insulating film between the gate electrode and the surface region of the second region;

an emitter electrode in contact with both the second region and the third region;

a fourth region of the second conductivity type having a high impurity concentration, formed adjoining an other side of the first region;

a plurality of fifth regions of the second conductivity type, selectively formed surrounding the fourth region to have a lower impurity concentration than the impurity concentration of the fourth region; and a collector electrode in contact with both the fourth region and the fifth regions.

2. A conductivity modulation type MOSFET according to claim 1, further comprising a plurality of sixth regions of the first conductivity type, formed between the fourth regions and surrounded by the fifth regions to have a higher impurity concentration than that of the first region.

3. A conductivity modulation type MOSFET according to claim 1, wherein the low impurity concentration is about $10^{15} cm^{-3}$ and the high impurity concentration is about $10^{18} cm^{-3}$.

4. A conductivity modulation type MOSFET comprising:

a first region of a first conductivity type having a low impurity concentration;

a plurality of second regions of a second conductivity type selectively formed in a surface region of one side of the first region;

a plurality of third regions of the first conductivity type selectively formed in a surface region of the second regions;

a plurality of gate electrodes each formed above a surface region of the second region located between the first region and the third region;

a gate insulating film between the gate electrode and the surface region of the second region;

an emitter electrode in contact with both the second region and the third region;

a fourth region of the first conductivity type, formed adjoining to another side of the first region and having a lower impurity concentration than the impurity concentration of the first region;

a plurality of fifth regions, selectively formed in the fourth region and having a higher impurity concentration than the impurity concentration of the fourth region;

a sixth region of the second conductivity type adjoining sides of the fourth region and the fifth regions, opposite the first region, the impurity concentration of the sixth region being lower than the impurity concentration of the fifth region; and a collector electrode in contact with the sixth region.

5. A conductivity modulation type MOSFET according to claim 4, wherein the low impurity concentration is about $10^{15} cm^{-3}$.

* * * * *